United States Patent [19]

Kriedt et al.

[11] Patent Number: 4,458,211
[45] Date of Patent: Jul. 3, 1984

[54] INTEGRABLE SIGNAL-PROCESSING SEMICONDUCTOR CIRCUIT

[75] Inventors: Hans Kriedt, Munich; Andreas Dietze, Valley, both of Fed. Rep. of Germany

[73] Assignee: Siemens Aktiengesellschaft, Berlin and Munich, Fed. Rep. of Germany

[21] Appl. No.: 413,772

[22] Filed: Sep. 1, 1982

[30] Foreign Application Priority Data

Sep. 3, 1981 [DE] Fed. Rep. of Germany ....... 3134936

[51] Int. Cl.$^3$ .............................................. H03F 3/45
[52] U.S. Cl. .................................... 330/257; 330/261
[58] Field of Search ............... 330/252, 254, 257, 259, 330/260, 261, 288, 307

[56] References Cited

U.S. PATENT DOCUMENTS 4,216,431 8/1980 Shibata et al. ...................... 330/261

Primary Examiner—James B. Mullins
Assistant Examiner—G. Wan
Attorney, Agent, or Firm—Herbert L. Lerner; Laurence A. Greenberg

[57] ABSTRACT

Integrable signal-processing semiconductor circuit, including four transistors being combined into two pairs, the transistors of each pair being connected together through their current inputs forming first and second differential amplifiers, the current outputs of one transistor of each transistor pair being connected to each other and to a first signal output and the current outputs of the other transistor pair being connected to each other and to a second signal output, third and fourth differential amplifiers addressed by first and second signals, first and second current mirror amplifiers each being connected to one output of the third differential amplifier, third and fourth current mirror amplifiers each being connected to one output of the fourth differential amplifier, reference potential connected to the current mirror amplifiers, a supply potential connected to the current outputs of the transistors, two load elements connected to the supply potential, the current inputs of the transistors of the first differential being connected to the first current mirror amplifier and the current inputs of the transistors of the second differential amplifier being connected to the second current mirror amplifier, the controls of one transistor of each pair being connected together to the third current mirror amplifier and through one load element to the supply potential, and the controls electrode of the other transistor of each pair being connected together to the fourth current mirror amplifier and through the other load element to the supply potential.

11 Claims, 6 Drawing Figures

INTEGRABLE SIGNAL-PROCESSING SEMICONDUCTOR CIRCUIT

The invention relates to an integrable signal-processing semiconductor circuit, in which four identical transistors are combined in pairs through their current input electrodes, forming a fisrt and a second differential amplifier, in which one transistor of each of the first and second differential amplifiers are connected together through the control electrodes thereof and are addressed by a first signal, while the mutually connected control electrodes of the two other transistors are likewise controlled by a signal which is in phase opposition, for instance, to the first signal, the four transistors of the two differential amplifiers are furthermore combined through their current output electrodes in pairs and are each connected to one of two signal output terminals in such a manner that the two transistors connected to the same signal output terminal are only connected directly to each other through their current output electrodes, the current input electrodes of the transistors of the first differential amplifier are connected through the current-carrying path of a fifth transistor and the current input electrodes of the transistors of the second differential amplifier are connected through the current-carrying path of a sixth transistor, both to the reference potential of the circuit, and the current output electrodes of the transistors which are connected to the two output terminals of the two differential amplifiers are also connected to another supply potential, the two output terminals are referred to the reference potential of the circuit and the control electrodes of the fifth and sixth transistor are addressed by a second differential signal.

Such a circuit is shown in "Siemens Integrierte Schaltungen für die Unterhaltungselektronik (Siemens Integrated Circuits for Entertainment Electronics), Data Book 1980/81, Pages 294 and 295". The known circuit can be used, for instance, among other things as a mixer stage, as a coincidence demodulator, as an AM-modulator and demodulator as well as a volume control. However, it requires higher supply voltages.

In contrast thereto, it is accordingly an object of the invention to provide an integrable signal-processing semiconductor circuit, which overcomes the hereinafore-mentioned disadvantages of the heretofore-known devices of this general type, and which is suitable for this as well as other functions which can be operated at low supply voltages, i.e. around one volt, and still exhibits high stability as well as a good $((S+N)/N)$ ratio ($S$=signal amplitude and $N$=noise amplitude) even if used with signals below the limitation set in. In addition, the circuit according to the invention should offer the advantage of having the same propagation time in both signal paths to the mixer, which is important for mixing two correlated signals, for instance, for AM and FM-demodulation.

With the foregoing and other objects in view there is provided, in accordance with the invention, a semiconductor circuit in which the two transistors outside the first and the second differential amplifier are each provided in the form of the output transistor of a current mirror amplifier and that in addition, two further current mirrors and two further differential amplifiers are provided; that each one of the two outputs of the third differential amplifier serves for controlling one of the two current mirror amplifiers connected to the current input electrodes of the transistors of the first and the second differential amplifier, while the remaining two current mirror amplifiers are each controlled by one of the two outputs of the fourth differential amplifier and in turn are each connected with their output to the control electrode of one of the two transistors of the first differential amplifier, and the control electrodes of the two transistors of the first differential amplifier are each connected through one load element, to the other supply potential of the circuit, which is not used as the reference potential.

In accordance with another feature of the invention, the current mirror amplifiers and the third and fourth differential amplifiers include transistors, the transistors of the first and second differential aplifiers and the current mirror amplifiers being a group of transistors of the same conductivity type with respect to the base and channel zones thereof, and the transistors forming the third and fourth differential amplifiers are complimentary to the transistors of the group of transistors.

In accordance with a further feature of the invention, the third and fourth differential amplifiers and current mirror amplifiers include transistors, and the transistors of each of the differential and current mirror amplifiers are bipolar transistors.

In accordance with an added feature of the invention, the current mirror amplifiers each include an output transistor having a current input electrode connected to the circuit reference potential source, and a control electrode, and a diode forming an input of each of the current mirror amplifiers and having an anode connected to the control electrode of the output transistor.

In accordance with an additional feature of the invention, the diode has a cathode connected to the circuit reference potential source, and the diode is in the form of a transistor being identical to the output transistor and having a short circuited base-collector path.

In accordance with again another feature of the invention, there is provided a resistor connected between the current input electrodes of the output transistor and the circuit reference potential source, and another resistor connected between the cathode of the diode and the circuit reference potential source.

In accordance with again a further feature of the invention, the third and fourth differential amplifiers receiving the first and second signals as input signals have the same dimensions and the current mirror amplifiers have the same dimensions, and the first and second input signals have equal propagation times up to the input of the combination of the first and second differential amplifiers.

In accordance with again an added feature of the invention, the four transistors of the first and second differential amplifiers are of the npn type.

In accordance with again an additional feature of the invention, the first and second signal outputs are referred to the circuit reference potential source.

In accordance with yet another feature of the invention, the third and fourth differential amplifiers have current input electrodes being connected to each other, and including two current sources each being connected between the current input electrodes of a respective one of the third and fourth differential amplifiers and the circuit supply potential source, provided as a reference potential for the third and fourth differential amplifiers.

In accordance with a concomitant feature of the invention, there is provided an auxiliary potential source supplying a potential deviating from the circuit supply and reference potentials, and another load element connected between the auxiliary potential source and the control electrodes of the transistor of the first and second differential amplifiers.

Other features which are considered as characteristic for the invention are set forth in the appended claims.

Although the invention is illustrated and described herein as embodied in an integrable signal-processing semiconductor circuit, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings, in which.

It should be noted that in the embodiment examples shown in the figures, bipolar transistors are used exclusively, and therefore the control electrode is represented by the base terminal, the current input electrode by the emitter terminal and the current output electrode by the collector terminal. However, other types of transistors, for instance self-locking MOS field effect transistors, can also de used. The current input electrode is then identified with the source terminal, the current output electrode with the drain terminal, and the control electrode with the gate of the field effect transistor.

Figure 1:
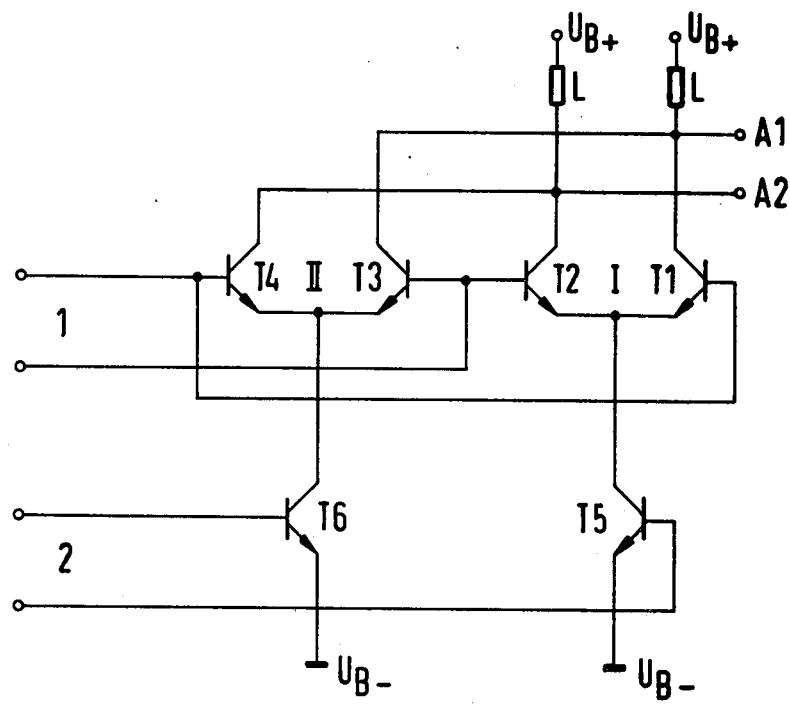
FIG. 1 is a schematic circuit diagram showing a prior art device.

Referring now to the figures of the drawings and first particularly to FIG. 1 thereof, there is seen a circuit which forms the starting point of the invention, and which includes two emitter-coupled differential amplifiers I and II that are constructed using four npn transistors T1 to T4. The base terminal of the transistor T1 of the first differential amplifier I and the base terminal of the transistor T4 of the second differential amplifier II are jointly connected to a first signal input terminal. Furthermore, the base terminal of the transistor T2 of the first differential amplifier I and the base terminal of the transistor T3 of the second differential amplifier II are jointly connected to a second signal input terminal. The two signal input terminals are driven together by a first signal. Additionally, the collector of the transistor T1 and the collector of the transistor T3 are connected on one hand to a common terminal A1 for the output signal and, on the other hand through a load element L which may be represented by a resistor, to a supply potential $U_{B+}$ which is not used as the reference potential of the circuit. Likewise, the collectors of the two other transistors T2 and T4 are connected together to a second terminal A2 for the output signal and are furthermore connected through a common load element L to the above-mentioned supply potential $U_{B+}$. Two further npn transistors T5 and T6 have emitters which are connected (optionally using one resistor each) to the terminal for a supply potential $U_{B-}$ used as the reference potential. The base electrodes of the transistors T5 and T6 each form one terminal each for a second input signal. Finally, the collector of the npn transistor T5 is connected to the emitters of the two transistors T1 and T2 of the first differential amplifier I, and the collector of the npn transistor T6 is connected to the emitters of the transistors T3 and T4 of the second differential amplifier II.

The hereinafore-described circuit, shown in FIG. 1, belongs to the state of art. It also forms part of the semiconductor circuit according to the invention which is shown as a block and schematic circuit diagram in FIG. 2. As may be seen from FIG. 2, the first differential amplifier I is formed of the two npn transistors T1 and T2, and the second differential amplifier II is formed of the two npn transistors T3 and T4 as is the case in FIG. 1. The emitters of the two transistors of the first differential amplifier I are connected to each other, optionally through resistors, and the central connecting point is furthermore connected to the output of a first current mirror amplifier S1. The emitters of the two transistors T3, T4 of the second differential amplifier II are likewise connected to each other (possibly also through resistors), and are furthermore likewise connected to the output of a second current mirror amplifier S2. Both current mirror amplifiers S1 and S2 as well as the current mirror amplifiers S3 and S4 yet to be discussed are connected to the supply terminal providing the reference potential $U_{B-}$.

Figure 4:
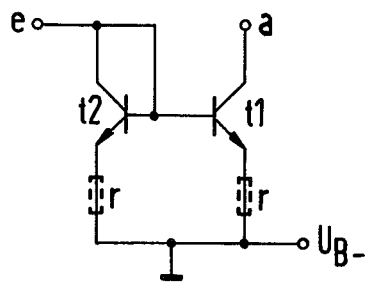
FIGS. 4–6 are schematic circuit diagrams of preferred embodiments of the circuit according to the invention.

The base terminals of transistor T1 of the first differential amplifier I and of the transistor T4 of the second differential amplifier II are connected together through a common load element L* (such as a resistor) to the supply terminal furnishing the other supply potential $U_{B+}$. The bases of the transistors T1 and T4 are also connected to the output of a third current mirror amplifier S3. The base terminals of the two other transistors T2 and T3 of the two differential amplifiers I and II are likewise connected together through a further load member L* to the other supply potential $U_{B+}$. The bases of the transistors T2 and T3 are also connected to the output of a fourth current mirror amplifier S4. The four current mirror amplifiers S1 to S4 are formed in a known manner of transistors of the same type as the transistors of the two differential amplifiers I and II, i.e., in the embodiment example, they are formed of npn transistors of the bipolar type. A circuit such as that shown in FIG. 4 is normally used.

The collector of the transistor T2 of the first differential amplifier I (which in turn is connected through its base to the transistor T3 of the second differential amplifier II) and the collector of the transistor T4 of the second differential amplifier II (which in turn is connected through its base to the transistor T1 of the first differential amplifier I), are connected together, and are connected through a load element L to the supply terminal tied to the other supply potential $U_{B+}$. The collectors of the two other transistors T1 and T3 are likewise connected together and are also connected through a further load element to the just mentioned supply terminal $U_{B+}$. The connecting points between the collector pairs and the load elements in this case also form two output terminals A1 and A2 as in the circuit according to FIG. 1. Preferably, the output signal to be evaluated appears between the two terminals A1 and A2. It may, however, also be important to use the signal appearing between the terminal A1 or the terminal A2 on one hand, and the terminal $U_{B-}$ on the other hand, furnishing the reference potential as an output signal of the circuit.

A third differential amplifier III which is constructed in the usual manner from two transistors having emitters being coupled together (optionally through emitter transistors), is given a control signal $U_{eI}$ at the signal input thereof, which is formed at the base terminals of its two transistors. The collectors of the two transistors of the third differential amplifier III each form an output, one being provided for controlling the first current mirror amplifier S1, and the other for controlling the second current mirror amplifier S2.

A fourth differential amplifier IV, having a construction which corresponds to that of the third differential amplifier III, controls the third current mirror amplifiers S3 with one of its outputs, and controls the fourth current mirror amplifiers S4 with the other of its outputs. The fourth differential amplifier IV is driven by an input signal $U_{eII}$.

If the same propagation time is required in the two signal branches, such as is desired in the case of an FM-demodulator, the two differential amplifiers III and IV on one hand, and the current mirror amplifiers S1 and S4 on the other hand, must be identical.

Figure 3:
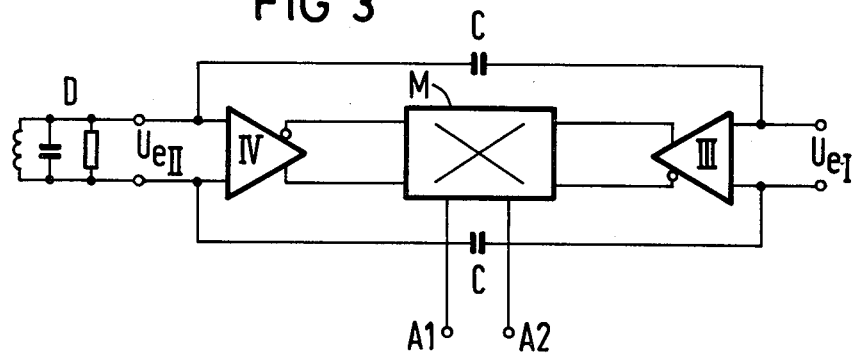
FIG. 3 is another block and schematic circuit diagram of a further embodiment of the device of FIG. 2, employing an FM-demodulator.

FIG. 3 illustrates the block circuit diagram of the circuit according to the invention, if the latter is to be used as an FM-coincidence demodulator. The block diagram of FIG. 3 corresponds to the detailed circuit diagram according to FIG. 6. The signal input of the third differential amplifier III which is controlled by the signal $U_{eI}$, obtains its signal directly, while for controlling the fourth differential amplifier IV, the same signal is applied to each input terminal of the differential amplifier IV through coupling capacitor C. Therefore, a signal $U_{eII}$ which is phase shifted 90°, is formed at a discriminator circuit D connected between the input terminals of the fourth differential amplifier IV, with correct tuning. The circuit part designated with reference numeral M corresponds to the combination of the four current mirror amplifiers S1 to S4 with the two first differential amplifiers I and II.

Figure 5:
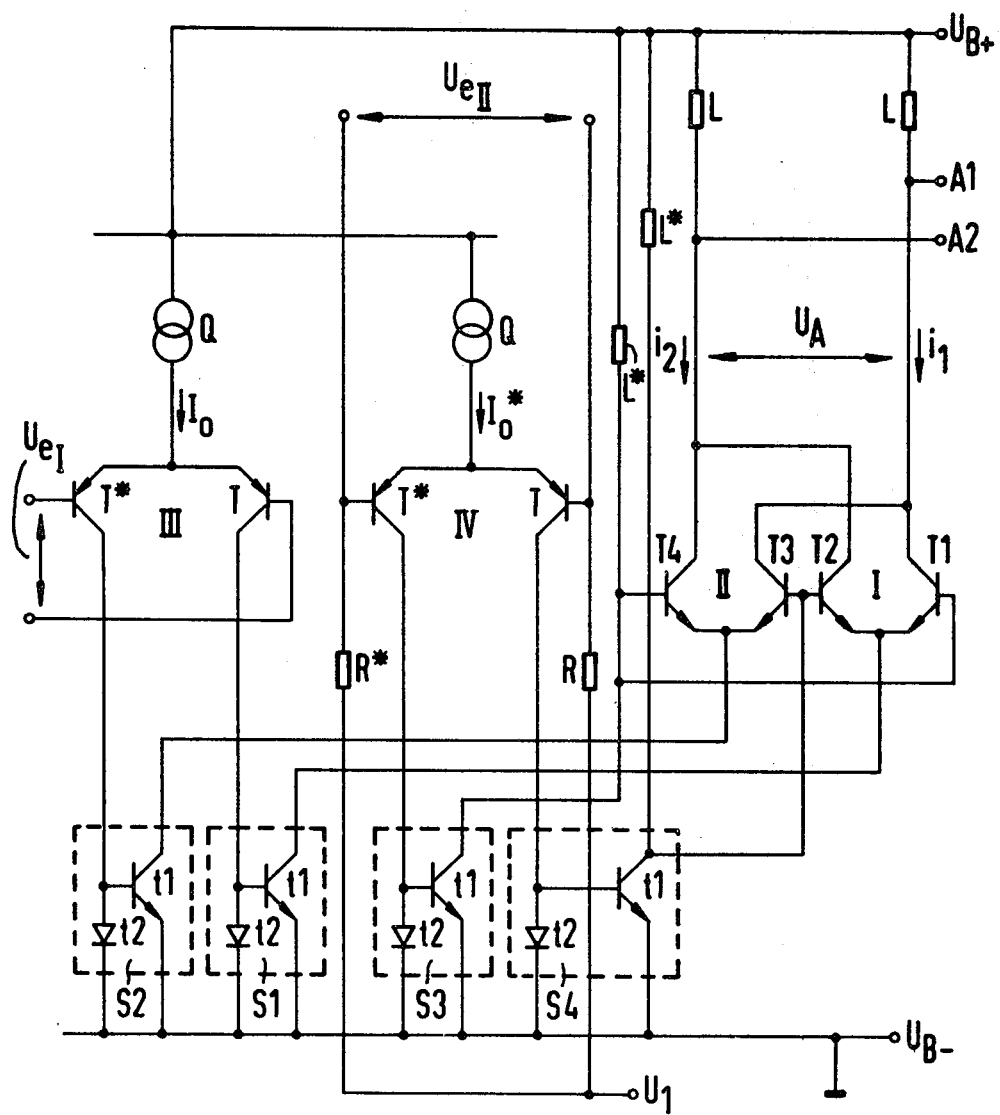
Figure 6:
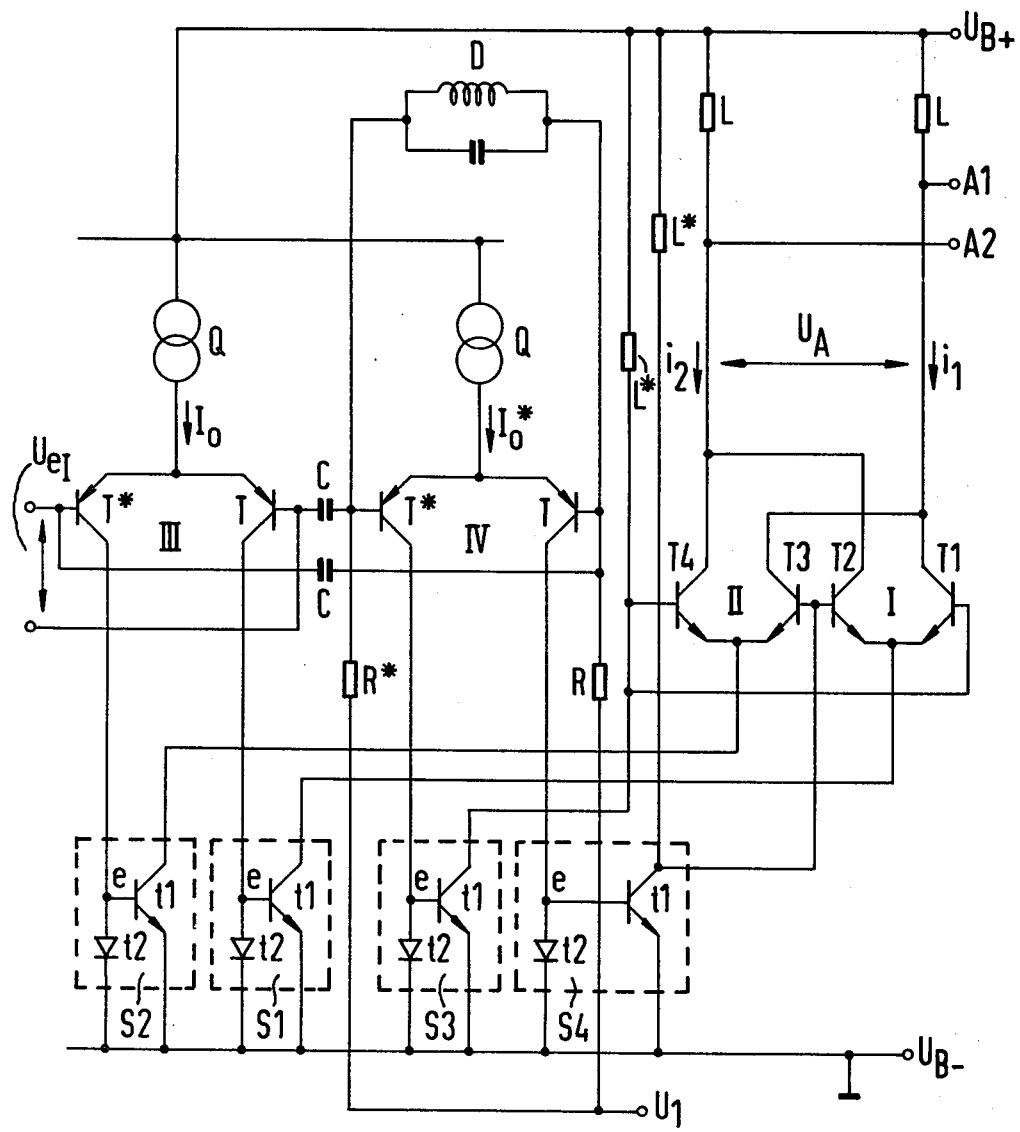

In the case of the embodiment of the system according to the invention seen in FIGS. 5 and 6, the comparison diodes t2 of the four current mirror amplifiers S1 to S4, which are poled in the forward direction, in each case serve as the load element for one branch of the differential amplifiers III and IV. The differential amplifiers III and IV are each constructed with two pnp transistors having the same properties, which form the connection to the reference potential $U_{B-}$. Each connection to the other supply potential $U_{B+}$ is accomplished through a current source Q each which impresses the current $I_o$ or the current $I_o^*$ through the current source.

The four current mirror amplifiers S1 to S4 are most advantageously provided in the manner shown in FIG. 4. In the usual manner, the diode t2 is provided in the form of a transistor of the same type as the output transistor t1 of the current mirror (in this case of the npn type). By shorting the collector-base path, only the emitter-base diode is operative in the transistor t2. The procedure can be the same if a current mirror for the current sources Q as may be seen from FIGS. 5 and 6 is used, with the sole difference that the two transistors are then pnp transistors, the emitters of which are connected to the supply terminals supplying the other supply potential $U_{B+}$. As may be seen from FIG. 4, the emitters of the current mirror transistors t1 and t2 can be connected through resistors r to the associated supply potential.

The signal inputs for $U_{eI}$ and $U_{eII}$ of the third and the fourth differential amplifiers III and IV can be connected (as is seen in the case of the differential amplifier IV in FIGS. 5 and 6) through resistors R and R*, respectively, to an auxiliary potential $U_1$ derived from the supply voltage by means of a voltage divider. Basically, exclusive addressing of the signal inputs by a signal source with a d-c and an a-c voltage component would also be possible.

The circuit shown in FIG. 6 according to the invention only differs from a circuit according to FIG. 5 regarding the connection of the input terminals of the third differential amplifier III, which serves for controlling the current mirrors connected to the first and to the second differential amplifiers I and II, (i.e. the base terminals of its two transistors T and T*). The input terminals of the amplifier III are connected to the corresponding terminals of the fourth differential amplifier IV through a phase shifter. This is accomplished by connecting together each of the base terminals of the transistors T and T* of the third differential amplifier to the corresponding base terminals in the fourth differential amplifier through a capacitor C, and connecting a parallel resonance circuit which is leaky in the equivalent circuit, between the base terminals of one of the differential amplifiers (in this case the differential amplifier IV).

The circuit shown in FIG. 5 according to the invention obviously represents a multiplicative mixer. If a signal $U_{eI}\sim\sin\omega_1 t$ is applied between the two input terminals of the third differential amplifier III and a signal $U_{eIII}\sim\sin\omega_2 t$ is applied to the two input terminals of the fourth differential amplifier IV, then a signal $U_A\sim|n\omega_1\pm m\omega_2|t$ with $n=1$ (2) $\infty$ and $m=1$ (2) $\infty$ appears between the two output terminals A1 and A2. The output signal present between the output terminal A2 and the reference potential terminal $U_{B-}$ is then provided by the same proportionality as the signal $U_A$, while the signal between the output terminal A1 and the reference potential terminal $U_{B-}$ is phase shifted 180°.

Figure 2:
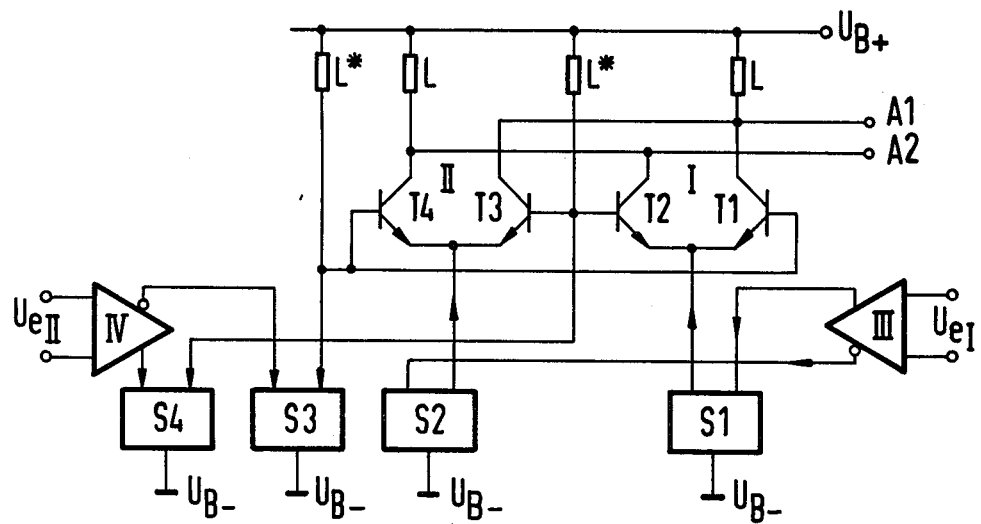
FIG. 2 is a block and schematic circuit diagram corresponding to the invention.

If the circuit shown in FIG. 5 is modified in the manner seen from FIG. 2 or FIG. 6, the circuit then obtained forms a demodulator for angle-modulated signals. For this purpose, the direct signal at the input $U_{eI}$ of the differential amplifier III, which is given by the expression $u_e=f((\phi_m\pm\Delta\phi)\cdot t)$, travels through the differential amplifier III to the current mirrors S1 and S2 and is available as a signal-carrying current for the transistors T1 to T4 of the first two differential amplifiers I and II. The signal $u_p=f(\phi_m\pm\Delta\phi)\cdot t+\pi/2+\phi$ due to the presence of the discriminator (formed of elements C and D), which is phase shifted 90°, is processed through the fourth differential amplifier IV and the two current mirror amplifiers S3 and S4 in the same manner and is then available as the differential voltage at the load resistors L* as a second control input for the mixing stage (formed of the differential amplifiers I and II). The currents in the collectors of the transistors T1 and T4 of the first and second differential amplifiers I and II, respectively, furnish the signal $f(u_e, u_p)$ appearing at the output terminals A1 and A2.

The circuit shown in FIG. 6 is particularly advantageous because it has been found that even with very low supply voltages $U_B$, such as 1 volt, proper operation of the circuit is still provided. It is a further advantage that, due to the same propagation time in the two signal branches, the offset of the discriminator curve can be kept small. It is also important, among other things, to note that the embodiment of the current mirrors S1, S2, S3 and S4 which can be seen in FIGS. 4 and 6 and are themselves customary. It should further be noted that in FIGS. 5 and 6, the input transistors t2 of the current mirrors S1 to S4 are shown as diodes for the sake of simplicity and may optionally be replaced by such a diode as well.

The foregoing is a description corresponding to German Application No. P 31 34 936.6, dated Sept. 3, 1981, the International priority of which is being claimed for the instant application, and which is hereby made part of this application. Any discrepancies between the foregoing specification and the aforementioned corresponding German application are to be resolved in favor of the latter.

We claim:

1. Integrable signal-processing semiconductor circuit, comprising four identical transistors each having current input, current output and control electrodes, said four transistors being combined into two pairs of transistors, said transistors of each pair being connected together through their current input electrodes forming first and second differential amplifiers, first and second signal outputs, the current output electrodes of one transistor of each transistor pair being connected to each other and to said first signal output and the current output electrodes of the other transistor of each transistor pair being connected to each other and to said second signal output, third and fourth differential amplifiers being addressed by respective first and second signals and each having two outputs, first and second current mirror amplifiers each being connected to a respective one of the outputs of said third differential amplifier, third and fourth current mirror amplifiers each being connected to a respective one of the outputs of said fourth differential amplifier, a circuit reference potential source connected to each of said current mirror amplifiers, a circuit supply potential source connected to the current output electrodes of said transistors being connected to said signal outputs, two load elements connected between said circuit supply potential source and first and second signal output, respectively, the current input electrodes of said transistors of said first differential amplifier being connected to said first current mirror amplifier and the current input electrodes of said transistors of said second differential amplifier being connected to said second current mirror amplifier, the control electrodes of one transistor of each transistor pair being connected together to said third current mirror amplifier and through one of said load elements to said circuit supply potential source, and the control electrodes of the other transistor of each transistor pair being connected together to said fourth current mirror amplifier and through the other of said load elements to said circuit supply potential source.

2. Semiconductor circuit according to claim 1, wherein said current mirror amplifiers and said third and fourth differential amplifiers include transistors, said transistors of said first and second differential amplifiers and said current mirror amplifiers being a group of transistors of the same conductivity type, and said transistors forming said third and fourth differential amplifiers are complementary to said transistors of said group of transistors.

3. Semiconductor circuit according to claim 1, wherein said third and fourth differential amplifiers and current mirror amplifiers include transistors, and said transistors of each of said differential and current mirror amplifiers are bipolar transistors.

4. Semiconductor circuit according to claim 1, wherein said current mirror amplifiers each include an output transistor having a current input electrode connected to said circuit reference potential source, and a control electrode, and a diode forming an input of each of said current mirror amplifiers and having an anode connected to said control electrode of said output transistor.

5. Semiconductor circuit according to claim 4, wherein said diode has a cathode connected to said circuit reference potential source, and said diode is in the form of a transistor being identical to said output transistor and having a short circuited base-collector path.

6. Semiconductor circuit according to claim 5, including a resistor connected between said current input electrode of said output transistor and said circuit reference potential source, and another resistor connected between said cathode of said diode and said circuit reference potential source.

7. Semiconductor circuit according to claim 1, wherein said third and fourth differential amplifiers receiving said first and second signals as input signals have the same dimensions and said current mirror amplifiers have the same dimensions, and said first and second input signals have equal propagation times up to the input of said first and second differential amplifiers.

8. Semiconductor circuit according to claim 1, wherein said four transistors of said first and second differential amplifiers are of the npn type.

9. Semiconductor circuit according to claim 1, wherein said first and second signal outputs are referred to said circuit reference potential source.

10. Semiconductor circuit according to claim 1, wherein said third and fourth differential amplifiers have current input electrodes being connected to each other, and including two current sources each being connected between said current input electrodes of a respective one of said third and fourth differential amplifiers and said circuit supply potential source, provided as a reference potential for said third and fourth differential amplifiers.

11. Semiconductor circuit according to claim 1, including an auxiliary potential source supplying a potential deviating from said circuit supply and reference potentials, and another load element connected between said auxiliary potential source and said control electrodes of said transistors of said first and second differential amplifiers.

* * * * *